United States Patent
Woods et al.

(10) Patent No.: US 7,389,783 B2
(45) Date of Patent: Jun. 24, 2008

(54) PROXIMITY MENISCUS MANIFOLD

(75) Inventors: Carl Woods, Aptos, CA (US); Michael G. R. Smith, Dublin, CA (US); John Parks, Hercules, CA (US); James P. Garcia, Santa Clara, CA (US); John M. de Larios, Palo Alto, CA (US)

(73) Assignee: Lam Research Corporation, Fremont, CA (US)

( * ) Notice: Subject to any disclaimer, the term of this patent is extended or adjusted under 35 U.S.C. 154(b) by 305 days.

(21) Appl. No.: 10/817,133

(22) Filed: Apr. 1, 2004

(65) Prior Publication Data

US 2005/0139318 A1 Jun. 30, 2005

Related U.S. Application Data

(63) Continuation-in-part of application No. 10/261,839, filed on Sep. 30, 2002, now Pat. No. 7,234,477.

(51) Int. Cl.
*B08B 3/02* (2006.01)
(52) U.S. Cl. .................. 134/148; 134/153; 134/198; 134/902
(58) Field of Classification Search ............ 134/902, 134/182, 183
See application file for complete search history.

(56) References Cited

U.S. PATENT DOCUMENTS

| | | | | |
|---|---|---|---|---|
| 3,461,843 A | * | 8/1969 | Noon | 399/238 |
| 3,953,265 A | * | 4/1976 | Hood | 438/8 |
| 4,021,278 A | * | 5/1977 | Hood et al. | 438/8 |
| 4,086,870 A | | 5/1978 | Canavello et al. | |
| 4,367,123 A | | 1/1983 | Beck | |
| 4,444,492 A | | 4/1984 | Lee | |
| 4,544,446 A | * | 10/1985 | Cady | 438/689 |
| 4,838,289 A | | 6/1989 | Kottman et al. | 134/153 |
| 5,102,494 A | | 4/1992 | Harvey et al. | |
| 5,180,431 A | | 1/1993 | Sugimoto et al. | |
| 5,271,774 A | | 12/1993 | Leenaars et al. | 134/31 |
| 5,294,257 A | | 3/1994 | Kelly et al. | |
| 5,335,681 A | * | 8/1994 | Schmid | 134/64 R |
| 5,343,234 A | | 8/1994 | Kuehnle | |

(Continued)

FOREIGN PATENT DOCUMENTS

EP  0 905 746 A1  3/1999

(Continued)

OTHER PUBLICATIONS

J.A. Britten, "A moving-zone Marangoni drying process for critical cleaning and wet processing," Oct. 1997, *Solid State Technology*.

(Continued)

*Primary Examiner*—Frankie L. Stinson
(74) *Attorney, Agent, or Firm*—Martine Penilla & Gancarella, LLP

(57) ABSTRACT

An apparatus for processing a substrate is provided which includes a first manifold module to generate a fluid meniscus on a substrate surface. The apparatus also includes a second manifold module to connect with the first manifold module and also to move the first manifold module into close proximity to the substrate surface to generate the fluid meniscus.

10 Claims, 10 Drawing Sheets

U.S. PATENT DOCUMENTS

| | | | |
|---|---|---|---|
| 5,361,449 A | | 11/1994 | Akimoto |
| 5,472,502 A | * | 12/1995 | Batchelder .................. 118/52 |
| 5,558,111 A | | 9/1996 | Lofaro |
| 5,601,655 A | | 2/1997 | Bok et al. |
| 5,660,642 A | | 8/1997 | Britten |
| 5,705,223 A | | 1/1998 | Bunkofske .................. 427/240 |
| 5,709,757 A | | 1/1998 | Hatano et al. |
| 5,807,522 A | | 9/1998 | Brown et al. |
| 5,830,334 A | | 11/1998 | Kobayashi |
| 5,882,433 A | | 3/1999 | Ueno |
| 5,893,004 A | | 4/1999 | Yamamura |
| 5,945,351 A | | 8/1999 | Mathuni ..................... 438/706 |
| 5,975,098 A | | 11/1999 | Yoshitani et al. |
| 5,979,475 A | * | 11/1999 | Satoh et al. ................. 134/140 |
| 5,989,478 A | | 11/1999 | Ouellette et al. |
| 5,997,653 A | | 12/1999 | Yamasaka ..................... 134/2 |
| 6,086,454 A | | 7/2000 | Watanabe et al. |
| 6,092,937 A | | 7/2000 | Snodgrass et al. |
| 6,103,636 A | | 8/2000 | Zahorik et al. |
| 6,108,932 A | | 8/2000 | Chai |
| 6,132,586 A | | 10/2000 | Adams et al. |
| 6,214,513 B1 | | 4/2001 | Cai et al. |
| 6,230,722 B1 | | 5/2001 | Mitsumori et al. |
| 6,238,107 B1 | * | 5/2001 | Inada ......................... 396/604 |
| 6,265,323 B1 | * | 7/2001 | Nakamura et al. .......... 438/748 |
| 6,273,104 B1 | * | 8/2001 | Shinbara et al. ............ 134/25.4 |
| 6,341,998 B1 | | 1/2002 | Zhang |
| 6,382,849 B1 | * | 5/2002 | Sakamoto et al. ........... 396/611 |
| 6,391,166 B1 | | 5/2002 | Wang |
| 6,398,975 B1 | | 6/2002 | Mertens et al. ............... 216/92 |
| 6,417,117 B1 | | 7/2002 | Davis |
| 6,431,190 B1 | * | 8/2002 | Oka et al. .................... 134/148 |
| 6,433,541 B1 | | 8/2002 | Lehman et al. |
| 6,446,358 B1 | | 9/2002 | Mitsumori et al. |
| 6,474,786 B2 | | 11/2002 | Percin et al. |
| 6,488,040 B1 | | 12/2002 | De Larios et al. |
| 6,491,764 B2 | | 12/2002 | Mertens et al. ............... 134/36 |
| 6,495,005 B1 | | 12/2002 | Colgan et al. |
| 6,514,570 B1 | | 2/2003 | Matsuyama et al. |
| 6,527,861 B2 | * | 3/2003 | Takekuma .................. 118/54 |
| 6,530,823 B1 | | 3/2003 | Ahmadi et al. |
| 6,531,206 B2 | | 3/2003 | Johnston et al. |
| 6,550,988 B2 | | 4/2003 | Sugimoto et al. |
| 6,555,017 B1 | | 4/2003 | Rushford et al. |
| 6,616,772 B2 | | 9/2003 | De Larios et al. |
| 6,629,540 B2 | | 10/2003 | Mitsumori et al. |
| 6,669,779 B2 | * | 12/2003 | Gurer et al. ................. 118/300 |
| 6,742,279 B2 | * | 6/2004 | Lubomirsky et al. .......... 34/317 |
| 6,854,473 B2 | | 2/2005 | Hanson et al. |
| 6,921,466 B2 | * | 7/2005 | Hongo et al. ................ 204/198 |
| 6,954,993 B1 | | 10/2005 | Smith et al. |
| 6,988,326 B2 | | 1/2006 | O'Donnell et al. |
| 6,988,327 B2 | | 1/2006 | Garcia et al. |
| 7,000,622 B2 | | 2/2006 | Woods et al. |
| 7,069,937 B2 | | 7/2006 | Garcia et al. |
| 7,105,075 B2 | * | 9/2006 | Ilic et al. .................... 156/345.28 |
| 2002/0007869 A1 | | 1/2002 | Pui et al. |
| 2002/0121290 A1 | | 9/2002 | Tang et al. |
| 2002/0125212 A1 | | 9/2002 | Mertens et al. |
| 2003/0091745 A1 | | 5/2003 | Yogev et al. |
| 2003/0091754 A1 | | 5/2003 | Chihani et al. |
| 2003/0092264 A1 | | 5/2003 | Shinji et al. |
| 2003/0138968 A1 | | 7/2003 | Fisher et al. |
| 2004/0060573 A1 | | 4/2004 | Woods |
| 2004/0069319 A1 | | 4/2004 | Boyd et al. |
| 2004/0069329 A1 | | 4/2004 | de Larios et al. |
| 2004/0136494 A1 | | 7/2004 | Lof et al. |
| 2004/0178060 A1 | | 9/2004 | Ravkin et al. |
| 2004/0182422 A1 | | 9/2004 | Boyd et al. |
| 2005/0132515 A1 | | 6/2005 | Boyd et al. |
| 2005/0139318 A1 | | 6/2005 | Woods et al. |
| 2005/0145265 A1 | | 7/2005 | Ravkin et al. |
| 2005/0145267 A1 | | 7/2005 | Korolik et al. |
| 2005/0145268 A1 | | 7/2005 | Woods |
| 2005/0148197 A1 | | 7/2005 | Woods et al. |
| 2005/0217703 A1 | | 10/2005 | O'Donnell |
| 2006/0064895 A1 | | 3/2006 | Garcia et al. |

FOREIGN PATENT DOCUMENTS

| | | | |
|---|---|---|---|
| EP | 0 905 747 A1 | | 3/1999 |
| EP | 1 489 461 A1 | | 12/2004 |
| EP | 1 489 462 A2 | | 12/2004 |
| JP | 05837190 | | 3/1983 |
| JP | 62-150828 | * | 7/1987 |
| JP | 62150828 A | | 7/1987 |
| JP | 02280330 | | 11/1990 |
| JP | 02309638 | | 12/1990 |
| JP | 8-281230 | * | 10/1996 |
| JP | 08277486 | | 10/1996 |
| JP | 11031672 | | 2/1999 |
| JP | 11350169 | | 12/1999 |
| JP | 2003 151948 | | 11/2001 |
| WO | WO 99/16109 A1 | | 4/1999 |
| WO | WO 99/49504 | | 9/1999 |
| WO | WO 02/001613 A3 | | 1/2002 |
| WO | WO 02/32825 A1 | | 4/2002 |
| WO | WO 02/101795 A3 | | 12/2002 |
| WO | WO 03/014416 A2 | | 2/2003 |
| WO | WO 2004/030051 A2 | | 4/2004 |

OTHER PUBLICATIONS

Owa et al. "*Immersion lithography; its potential performance and issues*", Proceedings of the SPIE, SPIE, Bellingham, VA, US, vol. 5040, No. 1, Feb. 28, 2003, pp. 724-733, XP002294500.

Lim et al., "*Atomic Layer deposition of transition metals*", Department of Chemistry and Chemical Biology Harvard University, Nature Publishing Group, vol. 2, Nov. 2003, pp. 749-754.

ICKnowledge LLC, "*Technology Backgrounder: Atomic Layer Deposition*", ICKnowledge.com, 2004, pp. 1-7.

"*Chemical vapor deposition*", Wikipedia, the free encyclopedia, http://en.wikipedia.org/wiki/Chemical_vapor_deposition, 2005, p. 1-2.

Sigma-Aldrich, "*Atomic Layer Deposition (ALD)*", http://www.sigmaaldrich.com/Area_of_Interest/Chemistry/Materials_Science/Thin_Films, 2005, pp. 1-2.

\* cited by examiner

PROXIMITY MENISCUS MANIFOLD

CROSS REFERENCE TO RELATED APPLICATION

This is a continuation-in-part of a U.S. patent application Ser. No. 10/261,839, from which priority under 35 U.S.C. § 120 is claimed, entitled "Method and Apparatus for Drying Semiconductor Wafer Surfaces Using a Plurality of Inlets and Outlets Held in Close Proximity to the Wafer Surfaces" filed on Sep. 30, 2002 now U.S. Pat. No. 7,234,477. The aforementioned patent application is hereby incorporated by reference.

BACKGROUND OF THE INVENTION

1. Field of the Invention

The present invention relates to semiconductor wafer processing and, more particularly, to apparatuses and techniques for more efficiently applying and removing fluids from wafer surfaces while reducing contamination and decreasing wafer cleaning cost.

2. Description of the Related Art

In the semiconductor chip fabrication process, it is well-known that there is a need to process a wafer using operations such as etching, cleaning, drying, and plating. In each of these types of operations, liquids are typically either applied and or removed fluids for the etching, cleaning, drying, and plating processes.

For example, wafer cleaning may have to be conducted where a fabrication operation has been performed that leaves unwanted residues on the surfaces of wafers. Examples of such a fabrication operation include plasma etching (e.g., tungsten etch back (WEB)) and chemical mechanical polishing (CMP). In CMP, a wafer is placed in a holder which pushes a wafer surface against a moving pad. This moving pad uses a slurry which consists of chemicals and abrasive materials to cause the polishing. Unfortunately, this process tends to leave an accumulation of slurry particles and residues at the wafer surface. If left on the wafer, the unwanted residual material and particles may cause, among other things, defects such as scratches on the wafer surface and inappropriate interactions between metallization features. In some cases, such defects may cause devices on the wafer to become inoperable. In order to avoid the undue costs of discarding wafers having inoperable devices, it is therefore necessary to clean the wafer adequately yet efficiently after fabrication operations that leave unwanted residues.

After a wafer has been wet cleaned, the wafer must be dried effectively to prevent water or cleaning fluid remnants from leaving residues on the wafer. If the cleaning fluid on the wafer surface is allowed to evaporate, as usually happens when droplets form, residues or contaminants previously dissolved in the cleaning fluid will remain on the wafer surface after evaporation (e.g., and form spots). To prevent evaporation from taking place, the cleaning fluid must be removed as quickly as possible without the formation of droplets on the wafer surface. In an attempt to accomplish this, one of several different drying techniques are employed such as spin drying, IPA, or Marangoni drying. All of these drying techniques utilize some form of a moving liquid/gas interface on a wafer surface which, if properly maintained, results in drying of a wafer surface without the formation of droplets. Unfortunately, if the moving liquid/gas interface breaks down, as often happens with all of the aforementioned drying methods, droplets form and evaporation occurs resulting in contaminants being left on the wafer surface. The most prevalent drying technique used today is spin rinse drying (SRD).

FIG. 1 illustrates movement of cleaning fluids on a wafer 10 during an SRD drying process. In this drying process, a wet wafer is rotated at a high rate by rotation 14. In SRD, by use of centrifugal force, the water or cleaning fluid used to clean the wafer is pulled from the center of the wafer to the outside of the wafer and finally off of the wafer as shown by fluid directional arrows 16. As the cleaning fluid is being pulled off of the wafer, a moving liquid/gas interface 12 is created at the center of the wafer and moves to the outside of the wafer (i.e., the circle produced by the moving liquid/gas interface 12 gets larger) as the drying process progresses. In the example of FIG. 1, the inside area of the circle formed by the moving liquid/gas interface 12 is free from the fluid and the outside area of the circle formed by the moving liquid/gas interface 12 is the cleaning fluid. Therefore, as the drying process continues, the section inside (the dry area) of the moving liquid/gas interface 12 increases while the area (the wet area) outside of the moving liquid/gas interface 12 decreases. As stated previously, if the moving liquid/gas interface 12 breaks down, droplets of the cleaning fluid form on the wafer and contamination may occur due to evaporation of the droplets. As such, it is imperative that droplet formation and the subsequent evaporation be limited to keep contaminants off of the wafer surface. Unfortunately, the present drying methods are only partially successful at the prevention of moving liquid interface breakdown.

In addition, the SRD process has difficulties with drying wafer surfaces that are hydrophobic. Hydrophobic wafer surfaces can be difficult to dry because such surfaces repel water and water based (aqueous) cleaning solutions. Therefore, as the drying process continues and the cleaning fluid is pulled away from the wafer surface, the remaining cleaning fluid (if aqueous based) will be repelled by the wafer surface. As a result, the aqueous cleaning fluid will want the least amount of area to be in contact with the hydrophobic wafer surface. Additionally, the aqueous cleaning solution tends cling to itself as a result of surface tension (i.e., as a result of molecular hydrogen bonding). Therefore, because of the hydrophobic interactions and the surface tension, balls (or droplets) of aqueous cleaning fluid forms in an uncontrolled manner on the hydrophobic wafer surface. This formation of droplets results in the harmful evaporation and the contamination discussed previously. The limitations of the SRD are particularly severe at the center of the wafer, where centrifugal force acting on the droplets is the smallest. Consequently, although the SRD process is presently the most common way of wafer drying, this method can have difficulties reducing formation of cleaning fluid droplets on the wafer surface especially when used on hydrophobic wafer surfaces.

Additionally, in other wafer processing operations such as cleaning, etching, and plating, there are also problems with applying the fluids to the wafer and removing fluids from the wafer in an efficient manner that decreases contamination and increases wafer yield.

Therefore, there is a need for a method and an apparatus that avoids the prior art by enabling optimized fluid management and application to a wafer that reduces contaminating deposits on the wafer surface. Such deposits as often occurs today reduce the yield of acceptable wafers and increase the cost of manufacturing semiconductor wafers.

SUMMARY OF THE INVENTION

Broadly speaking, the present invention fills these needs by providing a substrate processing (e.g., drying, cleaning, etching, plating, etc.) apparatus that is capable of managing fluids on wafer surfaces while at the same time reducing wafer contamination. It should be appreciated that the present invention can be implemented in numerous ways, including as a process, an apparatus, a system, a device or a method. Several inventive embodiments of the present invention are described below.

In one embodiment, an apparatus for processing a substrate is provided which includes a first manifold module to generate a fluid meniscus on a substrate surface. The apparatus also includes a second manifold module to connect with the first manifold module and also to move the first manifold module into close proximity to the substrate surface to generate the fluid meniscus.

In another embodiment, a method for processing a substrate using a first manifold module and a second manifold module is provided. The method includes positioning the first module over a substrate surface to be processed and connecting the second module to the first module. The method also includes moving the second module so the first module is in close proximity to the substrate surface and generating a fluid meniscus with the first module where the first module is supplied with fluids from the second module. The method further includes applying the fluid meniscus to the substrate surface to perform a wafer processing operation.

In yet another embodiment, an apparatus for processing a substrate is provided which includes a first manifold module having a processing face with a first conduit configured to apply a first fluid to a substrate surface, a second conduit for applying a second fluid to the substrate surface, and a third conduit for removing the first fluid and the second fluid from the substrate surface where the applying and the removing generating a fluid meniscus on the substrate surface. The apparatus also includes a second manifold module being configured to move the first manifold module into close proximity to the substrate surface and to deliver the first fluid and the second fluid to the first module and to remove the first fluid and the second fluid that has been applied to the substrate from the first module.

The advantages of the present invention are numerous. Most notably, the apparatuses and methods described herein efficiently process (clean, dry, etch, plate, and other suitable type of wafer processing that involves optimal management of fluid application and/or removal from the wafer) semiconductor wafer while reducing unwanted fluids and contaminants remaining on a wafer surface. Consequently, wafer processing and production may be increased and higher wafer yields may be achieved due to efficient wafer processing.

The present invention enables the improved processing through the use of vacuum fluid removal in conjunction with processing fluid input that may be applied through usage of a proximity meniscus manifold which is configurable in any one of numerous ways through the interchanging of one or more manifold sections. The pressures generated on a fluid film at the wafer surface by the aforementioned forces enable optimal application and/or removal of fluid at the wafer surface with a significant reduction in remaining contamination as compared with other processing techniques. In addition, the present invention may utilize application of an isopropyl alcohol (IPA) vapor and processing fluid towards a wafer surface along with generation of a vacuum near the wafer surface at substantially the same time. It should be appreciated that although IPA is utilized in the exemplary embodiment, any other suitable type of vapor may be utilized such as for example, nitrogen, any suitable alcohol vapor, organic compounds, hexanol, ethyl glycol, acetone, etc. that may be miscible with water. It should be appreciated that any suitable alcohol vapor may contain any suitable types of alcohols. It should be appreciated that the any suitable alcohol can be any suitable carbon-based chemical with a hydroxy group attached to a saturated carbon atom. This enables both the generation and intelligent control of a meniscus and the reduction of fluid surface tension along a processing fluid interface and therefore enables optimal application and/or removal of fluids from the wafer surface without leaving contaminants. The meniscus generated by input of IPA, processing fluid and output of fluids may be moved along the surface of the wafer to process the wafer.

One or more primary manifolds with the desired inlet/outlet configurations for generating the corresponding fluid meniscus may be utilized on a manifold carrier. Depending on the wafer operations desired, a certain primary manifold may be moved by the wafer carrier into a place near the wafer location to be processed. If a different wafer operation is desired, another primary manifold that is designed for the different wafer operation may be moved into place for wafer processing by the wafer carrier. Consequently, depending on the wafer operation desired, a particular primary manifold that can generate a particular meniscus configuration may be moved into place for wafer processing operations by the manifold carrier. As a result, depending on the types of primary manifolds on the manifold carrier, any suitable types of wafer processing operations may be conducted without moving the wafer into separate wafer processing chambers. After the primary manifold has been located, for example, over the wafer region to be processed, a secondary manifold may be brought down to attach to the primary manifold. The primary manifold may then be pushed into close proximity to a surface of the wafer. Once the primary manifold is in close proximity to the wafer, the secondary manifold may input fluids to the primary manifold. The primary manifold may then generate the fluid meniscus on the wafer surface to proceed with the wafer processing operation. Therefore, different types of wafer operations may be done using different types of fluid meniscus. This has the advantage of decreasing wafer contamination during transport, and also by utilizing the meniscus to process the wafer, wafer contamination through optimal fluid application and removal may also reduce wafer contamination.

Other aspects and advantages of the present invention will become apparent from the following detailed description, taken in conjunction with the accompanying drawings, illustrating by way of example the principles of the present invention.

BRIEF DESCRIPTION OF THE DRAWINGS

The present invention will be readily understood by the following detailed description in conjunction with the accompanying drawings. To facilitate this description, like reference numerals designate like structural elements.

DETAILED DESCRIPTION

Figure 1:
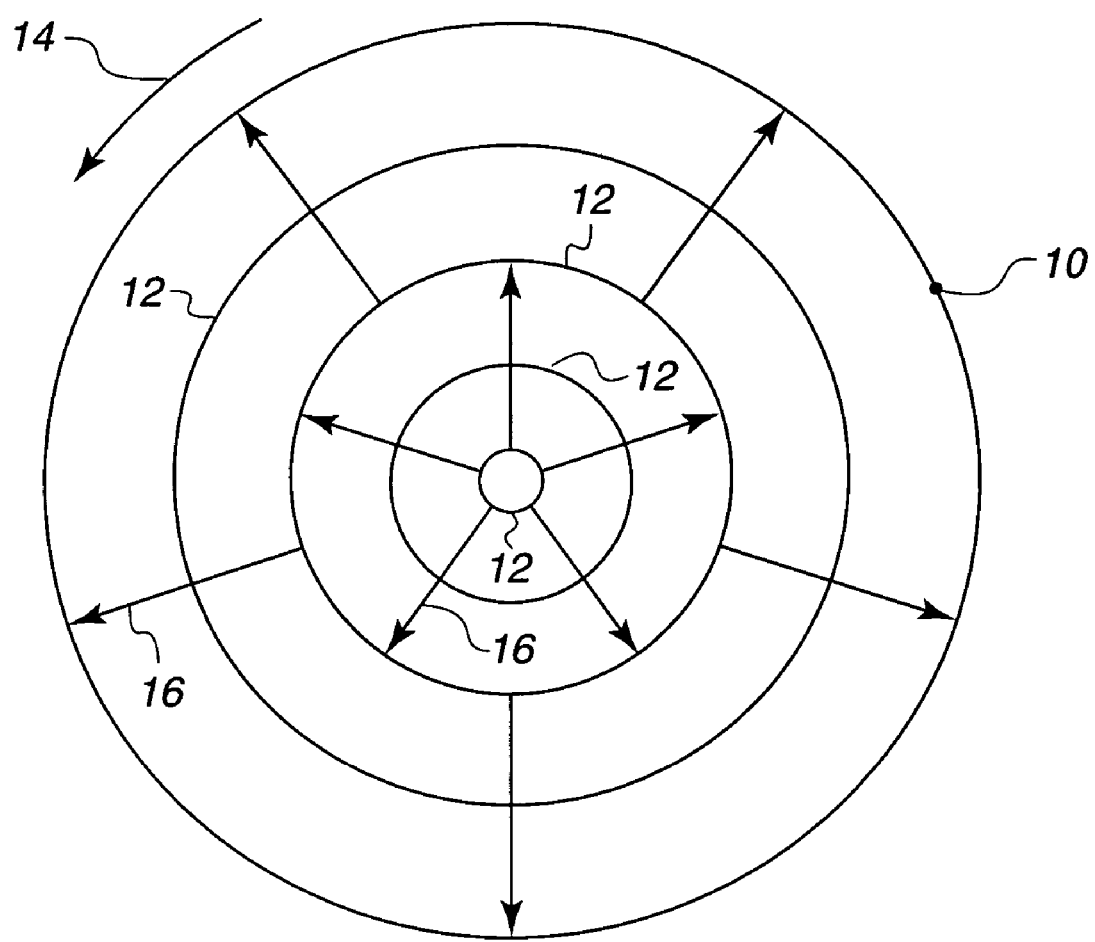
FIG. 1 illustrates movement of cleaning fluids on a wafer during an SRD drying process.

An invention for methods and apparatuses for processing a substrate is disclosed. In the following description, numerous specific details are set forth in order to provide a thorough understanding of the present invention. It will be understood, however, by one of ordinary skill in the art, that the present invention may be practiced without some or all of these specific details. In other instances, well known process operations have not been described in detail in order not to unnecessarily obscure the present invention.

While this invention has been described in terms of several preferable embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

The figures below illustrate embodiments of an exemplary wafer processing system using primary and secondary manifolds so any suitable wafer processing operation requiring any suitable meniscus configuration may be utilized. It should be appreciated that the system is exemplary, and that any other suitable types of configuration that would enable movement of the primary and/or secondary manifold into close proximity to the wafer may be utilized. In the embodiments shown, during a wafer processing operation, the primary manifold and the secondary manifold may move a fluid meniscus in a linear fashion from a center portion of the wafer to the edge of the wafer.

It should be appreciated that other embodiments may be utilized where the primary and secondary manifolds move the fluid meniscus in a linear fashion from one edge of the wafer to another diametrically opposite edge of the wafer, or other non-linear movements may be utilized such as, for example, in a radial motion, in a circular motion, in a spiral motion, in a zig-zag motion, random motion, etc. In other embodiments, the wafer may be moved and the manifolds may be kept stationary. In yet another embodiment, the primary and secondary manifolds as well as the wafer may be moved to generate the movement of the fluid meniscus over a wafer surface for the wafer processing. The motion may also be any suitable specified motion profile as desired by a user. In addition, in one embodiment, the wafer may be rotated and the proximity head moved in a linear fashion so the proximity head may process all portions of the wafer.

In addition, the proximity processing system described herein may be utilized to process any shape and size of substrates such as for example, 200 mm wafers, 300 mm wafers, flat panels, etc. The wafer processing system may be utilized for processing the wafer depending on the configuration of the system. In addition, the proximity heads utilized herein may be configured in any suitable number of ways to clean, dry, etch, or plate the wafer.

A fluid meniscus can be supported and moved (e.g., onto, off of and across a wafer) with a proximity head. Various proximity heads and methods of using the proximity heads are described in co-owned U.S. patent application Ser. No. 10/330,843 filed on Dec. 24, 2002 and entitled "Meniscus, Vacuum, IPA Vapor, Drying Manifold," which is a continuation-in-part of U.S. patent application Ser. No. 10/261,839 filed on Sep. 30, 2002 and entitled "Method and Apparatus for Drying Semiconductor Wafer Surfaces Using a Plurality of Inlets and Outlets Held in Close Proximity to the Wafer Surfaces," both of which are incorporated herein by reference in its entirety. Additional embodiments and uses of the proximity head are also disclosed in U.S. patent application Ser. No. 10/330,897, filed on Dec. 24, 2002, entitled "System for Substrate Processing with Meniscus, Vacuum, IPA vapor, Drying Manifold" and U.S. patent application Ser. No. 10/404,692, filed on Mar. 31, 2003, entitled "Methods and Systems for Processing a Substrate Using a Dynamic Liquid Meniscus." Still additional embodiments of the proximity head are described in U.S. patent application Ser. No. 10/404,270, filed on Mar. 31, 2003, entitled "Vertical Proximity Processor," U.S. patent application Ser. No. 10/603,427, filed on Jun. 24, 2003, and entitled "Methods and Systems for Processing a Bevel Edge of a Substrate Using a Dynamic Liquid Meniscus," U.S. patent application Ser. No. 10/606,022, filed on Jun. 24, 2003, and entitled "System and Method for Integrating In-Situ Metrology within a Wafer Process," U.S. patent application Ser. No. 10/607,611 filed on Jun. 27, 2003 entitled "Apparatus and Method for Depositing and Planarizing Thin Films of Semiconductor Wafers," U.S. patent application Ser. No. 10/611,140 filed on Jun. 30, 2003 entitled "Method and Apparatus for Cleaning a Substrate Using Megasonic Power," and U.S. patent application Ser. No. 10/742,303 entitled "Proximity Brush Unit Apparatus and Method." The aforementioned patent applications are hereby incorporated, by reference in their entirety.

Figure 2:
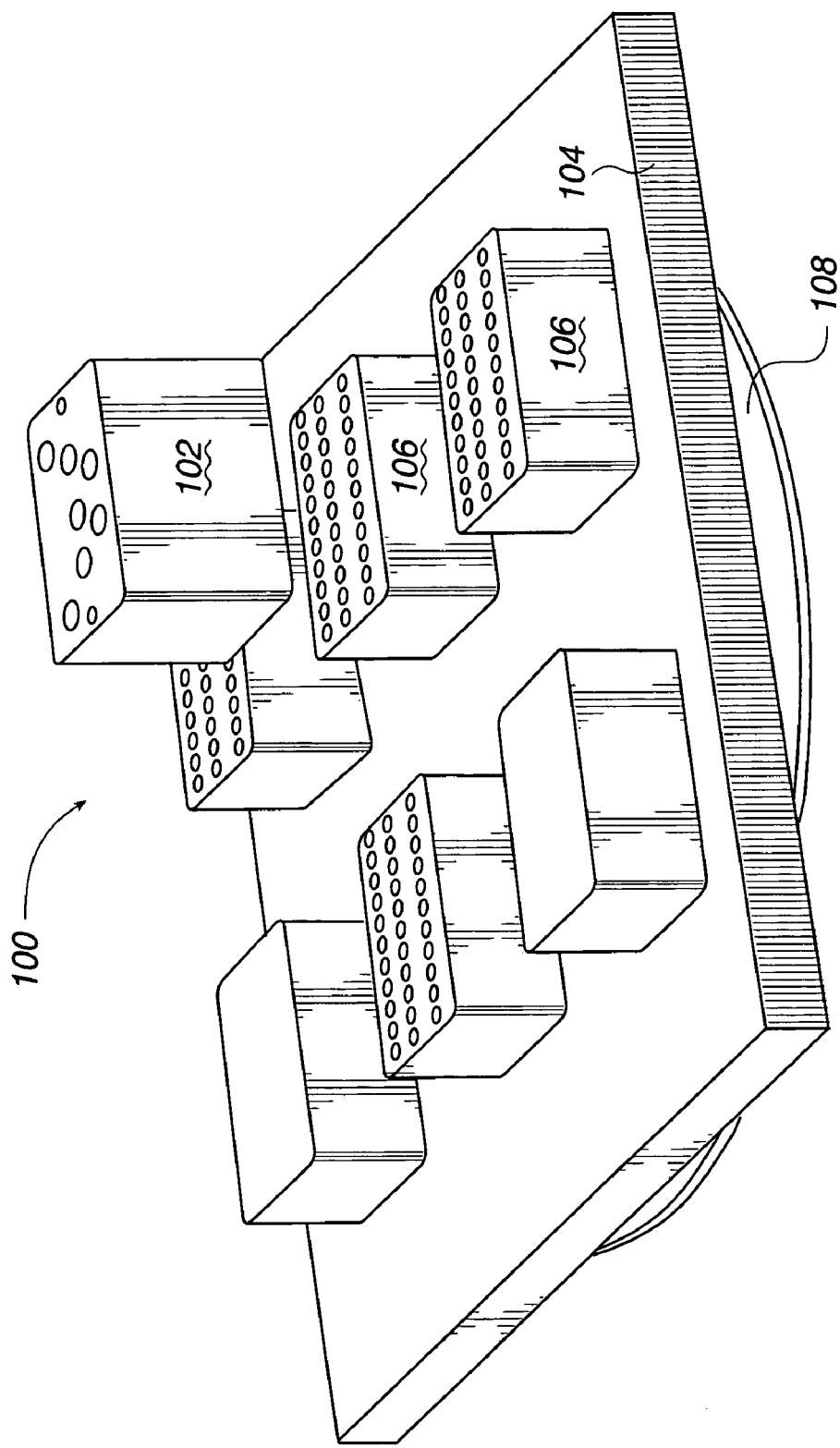
FIG. 2 illustrates a wafer processing system in accordance with one embodiment of the present invention.

FIG. 2 illustrates a wafer processing system 100 in accordance with one embodiment of the present invention. In one embodiment, the wafer processing system 100 includes a manifold carrier 104 which may house a primary manifold 106. It should be appreciated that the manifold carrier 104 may have the capability of housing any suitable number and/or types of primary manifolds 106. In addition, the manifold carrier may be configured to position any suitable one of the primary manifolds underneath a secondary manifold 102 (or over the secondary manifold 102 when an underside of the wafer is being processed).

The primary manifold 106 may be configured to receive a first fluid and a second fluid to apply to a wafer 108 and to output the first fluid and the second fluid that has been applied to the wafer 108. The primary manifold 106 may be configured to have inlets and outlets configured to be capable of generating a fluid meniscus. It should be appreciated that the fluid meniscus may be generated in any suitable fashion as described in the U.S. Patent Applications previously referenced and incorporated by reference. The primary manifold 106 may have any suitable configuration that can generate the fluid meniscus such as the configurations of proximity heads as discussed in the U.S. Patent Applications previously referenced and incorporated by reference. It should also be understood that the fluid meniscus may be configured in any suitable fashion depending on the type of wafer processing operations desired such as, for example, etching, cleaning, drying, and plating.

In one embodiment, the manifold carrier 104 may move the primary manifold 106 over the wafer 108 when the wafer 108 is to be processed. In addition, a particular primary manifold may have a particular purpose. For example, a particular primary manifold may be configured to generate a meniscus that cleans the wafer 108 and another primary manifold on the same manifold carrier may generate a meniscus that dries the wafer 108. In yet another embodiment, the wafer carrier may have further primary manifolds that are configured to process the wafer 108 in other types of operations such as, for example, etch, plate, etc. When the primary manifold 106 is positioned over the wafer 108 (or a region of the wafer 108) that is to be processed, the secondary manifold 102 may move down onto and attach itself to a top portion of the primary manifold 106. Then the secondary manifold 102 can push the primary manifold 106 down into close proximity to a surface of the wafer 108 that is to be processed.

In one embodiment, the manifold carrier 104 is configured to enable the primary manifold 106 to be moved down into close proximity to the wafer 108 by having an opening through which the primary manifold 106 may be pushed through. It should be appreciated that primary manifold 106 and the manifold carrier 104 may be configured in any suitable fashion that enables the manifold carrier 104 to move the primary manifold 106 into position to process the wafer 108. In one embodiment, the manifold carrier 104 may be configured to move the primary manifold 106 over the wafer 108. In another embodiment, the manifold carrier 104 may be configured to move the primary manifold 106 under the wafer 108. In yet another embodiment, there may be manifold carriers 104 over and below the wafer 108 so multiple surfaces of the wafer 108 may be processed at substantially the same time.

In an exemplary wafer processing operation, the manifold carrier may be configured to move a primary manifold 106, which may be a cleaning manifold, near a region of the wafer 108 to be cleaned. Then the secondary manifold 102 may move down onto the primary manifold 106 and push the primary manifold 106 down through the manifold carrier 104 into close proximity to the surface of the wafer 108. Once in close proximity to the surface, the secondary manifold 102 may input a first fluid and a second fluid specific for cleaning operation into the primary manifold 106. Then the primary manifold 106 may apply the first fluid and the second fluid to the surface of the wafer 108 while substantially at the same time applying vacuum to the surface of the wafer 108 to remove the first fluid and the second fluid. The removed first fluid and the second fluid may be outputted from the primary manifold 106 to the secondary manifold 102. The secondary manifold 102 may then remove the first fluid and the second fluid away. In this fashion, as described in further detail in reference to the U.S. Patent Applications referred to above, the fluid meniscus may be generated on the surface to process the wafer.

Once the wafer processing has been accomplished, the meniscus may be removed by stopping the application of the first and the second fluids. Then the secondary manifold 102 may move up and the primary manifold 106 may move up with the secondary manifold 102. In one embodiment, the secondary manifold 106 can then disengage from the primary manifold 106 leaving the primary manifold 106 in substantially the same position as it occupied before the beginning of the wafer processing operation. The manifold carrier 104 may then move a primary manifold 106' designed for drying to a location over the wafer 108 that has just been cleaned. After the primary manifold 106' is located over the wafer 108, the secondary manifold 106 can move down onto a top portion of the primary manifold 106'. Then the secondary manifold 106 can move the primary manifold 106' so a processing surface of the primary manifold 106' can move into close proximity with the surface of the wafer 108. After the primary manifold 106' has been moved into close proximity to the wafer 108, the secondary manifold 102 may start inputting a first fluid and a second fluid specific for drying to the primary manifold 106'. The primary manifold 106' may then apply the first fluid and the second fluid to the surface of the wafer 108 while at the same time applying a vacuum to the wafer 108 to generate a fluid meniscus as described in the U.S. Patent Applications as referenced above.

It should be appreciated that the first fluid may be any suitable fluid that may enhance the desired processing of the wafer 108. In an exemplary drying operation, the first fluid may be, for example, deionized water (DIW), DIW and a surfactant, etc. In an exemplary cleaning operation, the first fluid may be, for example, SC-1, SC-2, Ammonium Hydroxide (NH4OH), Tetramethylammonium Hydroxide (TMAH), etc. In an exemplary etching operation, the first fluid may be, for example, HF, ECK proprietary solution, KOH etc. In an exemplary plating operation, the first fluid may be, for example, Cu Sulfate, Ag Sulfate, Au Chloride, etc. It should also be understood that the second fluid may be any suitable fluid such as, for example IPA/N2, $N_2$, an azeotropic mixture of DIW and IPA with a $N_2$ carrier gas, etc. that may reduce the surface tension of the first fluid and therefore enhance the removal of fluid from the wafer surface.

Consequently, depending on the fluids utilized, different types of wafer processing operation may be conducted. In addition, depending on the configuration of the inlets and outlets on the primary manifold 106, 106', etc., different types of wafer operations may be conducted by the different primary manifolds on the manifold carrier 104. Therefore, the manifold carrier 104 may include manifolds that can operate to conduct at least one of or any combination of etching, plating, cleaning, drying etc. The manifold carrier 104 may then be a one stop wafer processing apparatus which may enhance contamination reduction because wafer transportation between different modules may be decreased.

Figure 3:
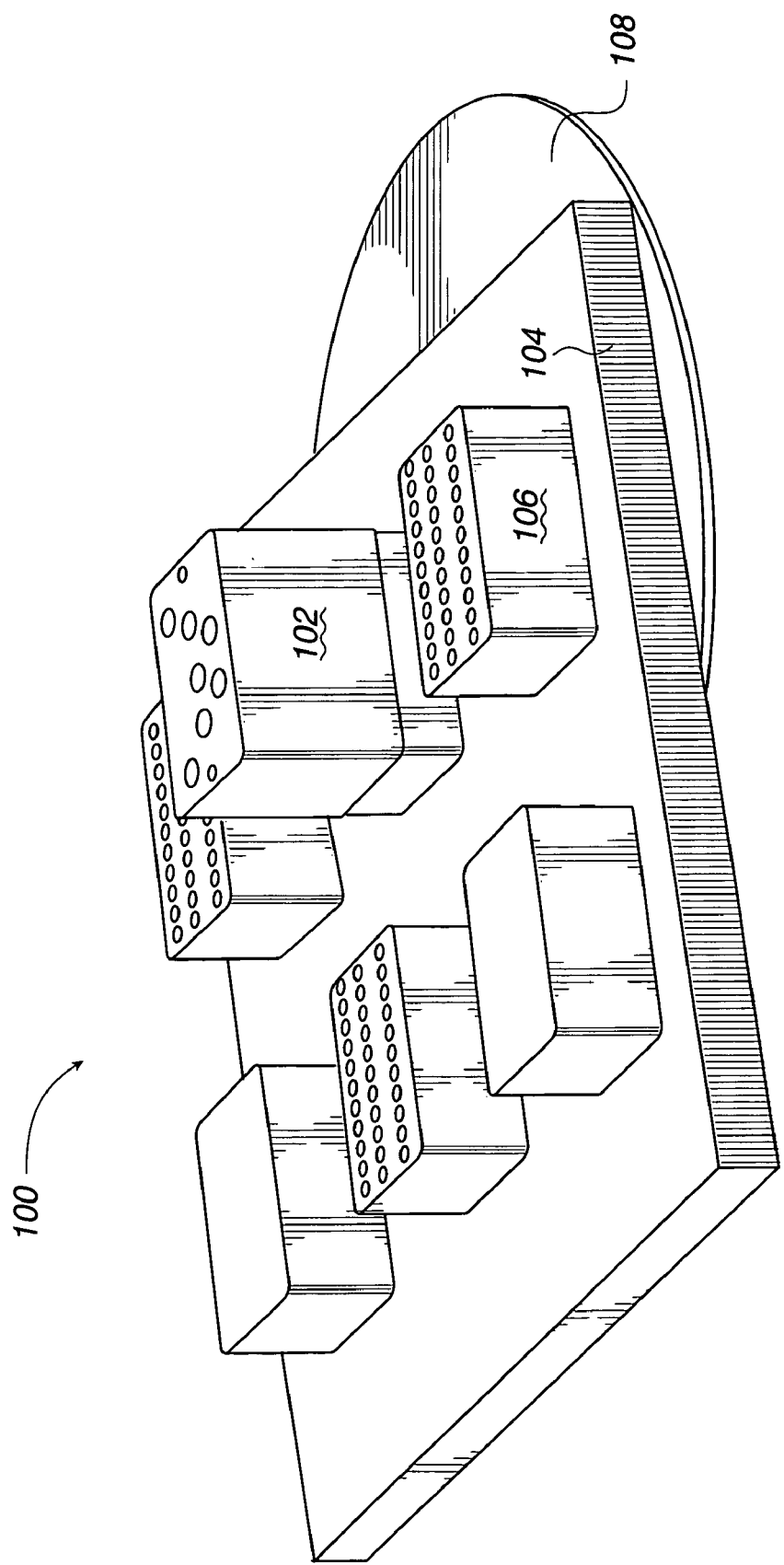
FIG. 3 shows the wafer processing system with the manifold carrier that has a secondary manifold that has coupled to a primary manifold in accordance with one embodiment of the present invention.

FIG. 3 shows the wafer processing system 100 with the manifold carrier 104 that has a secondary manifold 102 that has coupled to a primary manifold 106 in accordance with one embodiment of the present invention. In one embodiment, the secondary manifold 102 connects with the primary manifold 106 in such a way that passageways for fluid input and output are interconnected. In this fashion, the secondary manifold 102 may supply the primary manifold with the first fluid and the second fluid to be applied to the wafer 108. In addition, there may be passageways so the first fluid and the second fluid removed from the wafer surface may be transported from the primary manifold 106 to the secondary manifold 102.

In one embodiment, the secondary manifold 102 may have ports where fluids may be inputted and outputted. It should be appreciated that ports and fluid passageways in the secondary manifold 102 may be configured in any suitable fashion so the first fluid and the second fluid may be inputted to the primary manifold 106 and the first fluid and the second fluid applied to the wafer 108 may be removed from the primary manifold 106. In one embodiment, input ports may input the first fluid and the second fluid to the secondary manifold 102. Then the first fluid and the second fluid may travel through passageways that are, in one embodiment, machined into the secondary manifold 102. Through these passageways, the first fluid and the second fluid may travel to openings on the other side of the secondary manifold 102 where the fluid enters the openings in the primary manifold 106 which correspond to input ports for the first fluid and input ports for the second fluid. Then the first fluid and the second fluid may be transported through fluid passageways in the primary manifold 106 to inlets for the first fluid and inlets for the second fluid located on the processing surface of the primary manifold 106 that may apply the first fluid and the second fluid respectively to the surface of the wafer 108.

An outlet on the processing surface of the primary manifold may remove the first fluid and the second fluid from the region between the surface of the wafer 108 and the processing surface of the primary manifold 106. Therefore, the first and the second fluids may be transported through the primary manifold 106 to an output that may connect with in input in the second manifold 102. Then the fluids may be transported via passage ways in the secondary manifold 102 to outputs that may remove the fluids from the secondary manifold 102.

Figure 4:
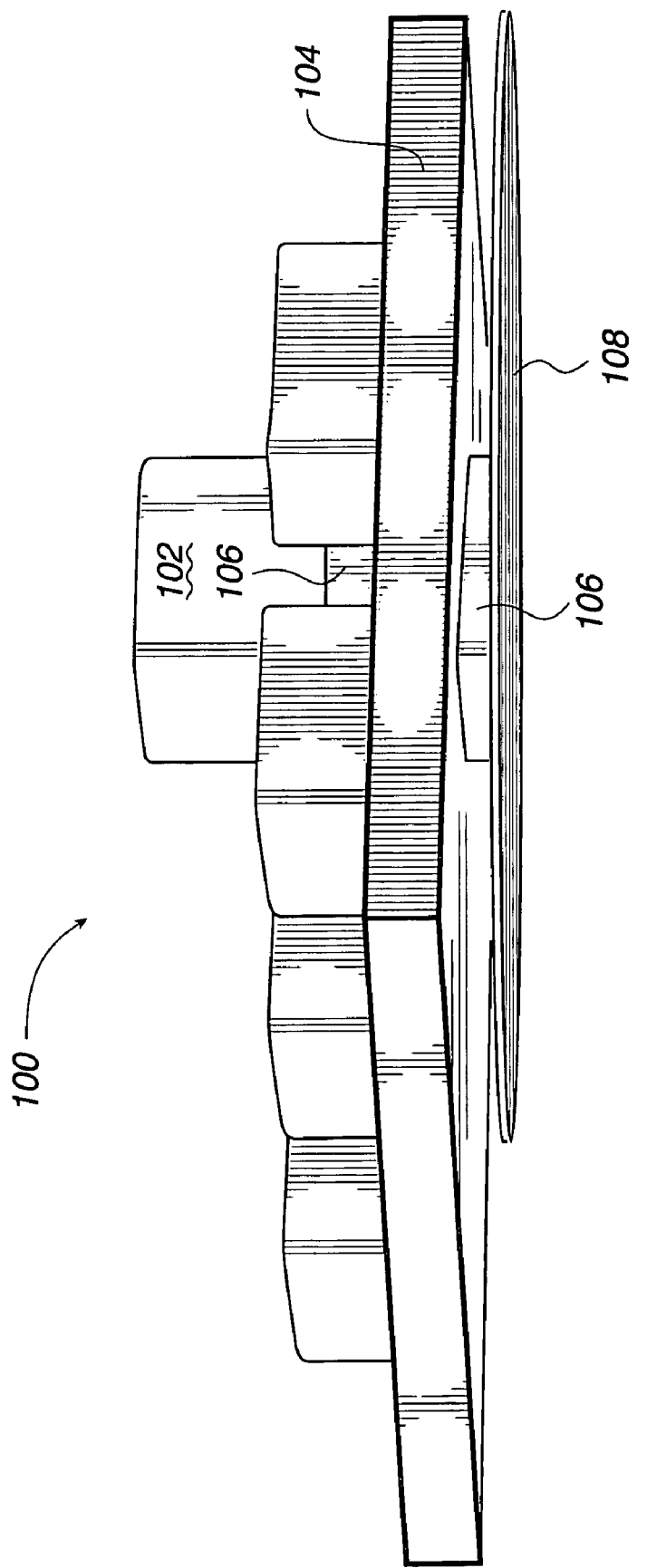
FIG. 4 illustrates a side view of the wafer processing system in accordance with one embodiment of the present invention.

FIG. 4 illustrates a side view of the wafer processing system 100 in accordance with one embodiment of the present invention. The wafer processing system 100 as depicted in FIG. 4 is shown during the processing of the wafer 108. The secondary manifold 102 has moved down onto the primary manifold 106 and connected with the primary manifold 106. The secondary manifold 102 has pushed the primary manifold 106 closer in proximity to the wafer 108 so the primary manifold 106 can generate a fluid meniscus on the wafer 108. It should be understood that the wafer 108 and/or the manifold carrier 104 can be moved in any suitable fashion so the fluid meniscus generated by the primary manifold 106 can process the desired regions of the wafer 108. In one embodiment, the wafer 108 may be moved, for example, in a rotational manner, a straight line, etc. In addition, the manifold carrier 104 may be moved in conjunction with the secondary manifold 102 to move the meniscus over the regions of the wafer 108 that requires processing.

Figure 5:
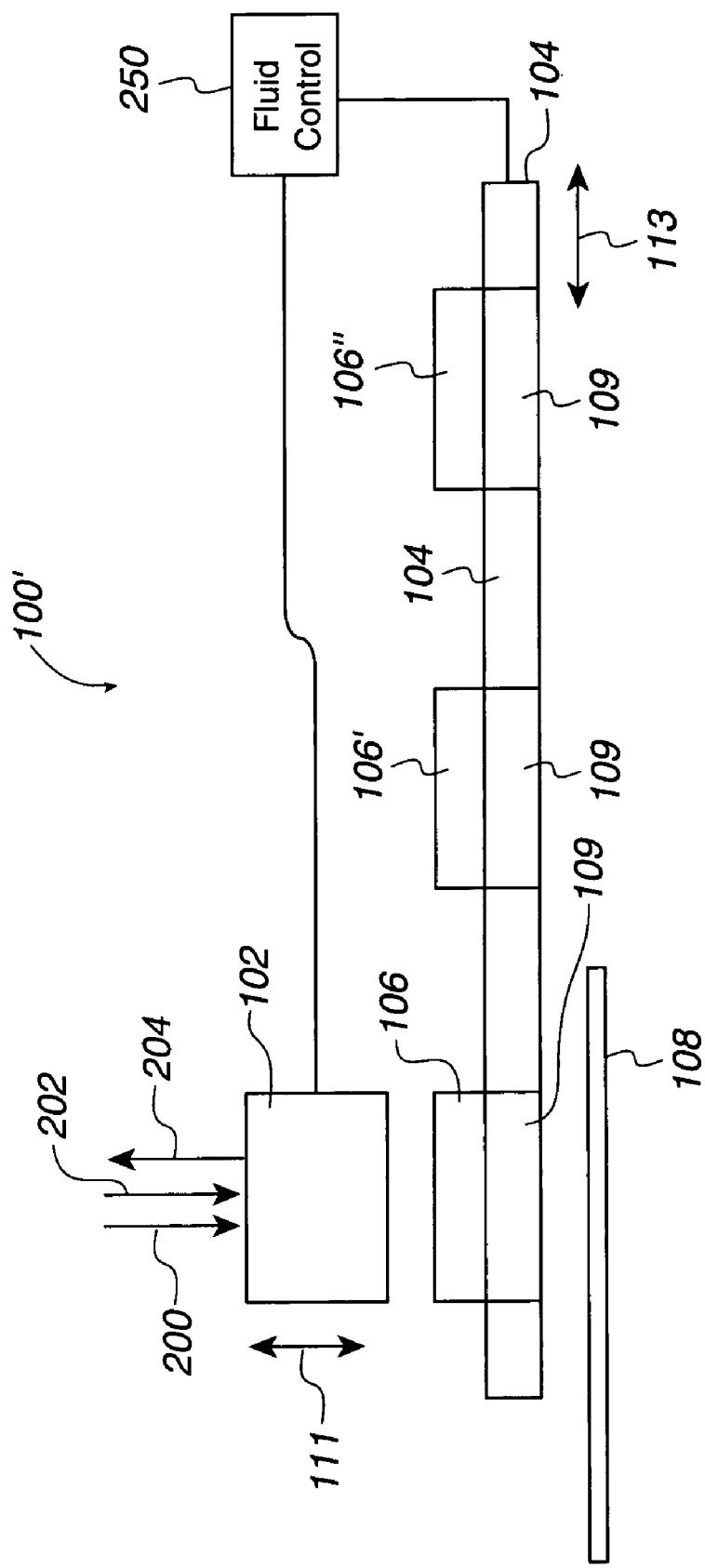
FIG. 5 illustrates a side view of a wafer processing system where the secondary manifold is positioned over the primary manifold in accordance with one embodiment of the present invention.

FIG. 5 illustrates a side view of a wafer processing system 100' where the secondary manifold 102 is positioned over the primary manifold 106 in accordance with one embodiment of the present invention. In one embodiment, the manifold carrier 104 may move in a motion 113 so depending on the meniscus and/or wafer processing operation desired, certain ones of the primary manifolds 106, 106', and 106" may be placed over the wafer 108. It should be appreciated that the motion 113 is only exemplary in nature and the manifold carrier 104 may be moved in any direction on any of an X-axis, Y-axis, and Z-axis. It should be appreciated that the wafer carrier 104 may be configured to be located below the wafer 108 to process the other side of the wafer 108. In yet another embodiment, there may be wafer carriers both over and under the wafer 108 so both sides of the wafer 108 may be processed substantially at the same time such as described in further detail in reference to FIG. 8B.

In one embodiment, the secondary manifold 102 is stationary and the manifold carrier 104 moves the primary manifold 106 under the secondary manifold 102. The secondary manifold 102 in such an embodiment is configured to move vertically to enable the secondary manifold 102 to connect with the primary manifold 106 and push the primary manifold down to be in close proximity with the wafer 108. In one embodiment, the manifold carrier 104 may have an opening 109 through which the primary manifold 106 may be moved into close proximity to the wafer 108. It should be appreciated that the secondary manifold 106 may be moved by any suitable moving apparatus such as, for example, a motorized arm, etc. In addition, the manifold carrier 104 may be moved in a horizontal plane to move the primary manifolds 106, 106', and 106" into position under the secondary manifold 102. The manifold carrier may also be moved by a suitable moving apparatus such as, for example, by motorized action, etc.

In one embodiment, the management of one or more of the manifold carrier 104 movement, the movement of the secondary manifold 102, fluid input and output between the primary manifold 106 and the secondary manifold 102, and the fluid input and output using inputs 200 and 202 and output 204 may be managed by a fluid control 250. The fluid control 250 may be any suitable software and/or hardware that can monitor wafer processing and make suitable adjustments and movements necessary for the wafer 108 to be processed as desired by using the primary manifold 106, the secondary manifold 102, and the manifold carrier 104. The inputs 200 and 202 may be utilized to input the first fluid and the second fluid to the secondary manifold 102. The output 204 may be utilized to remove the first fluid and the second fluid from the secondary manifold 102.

Figure 6:
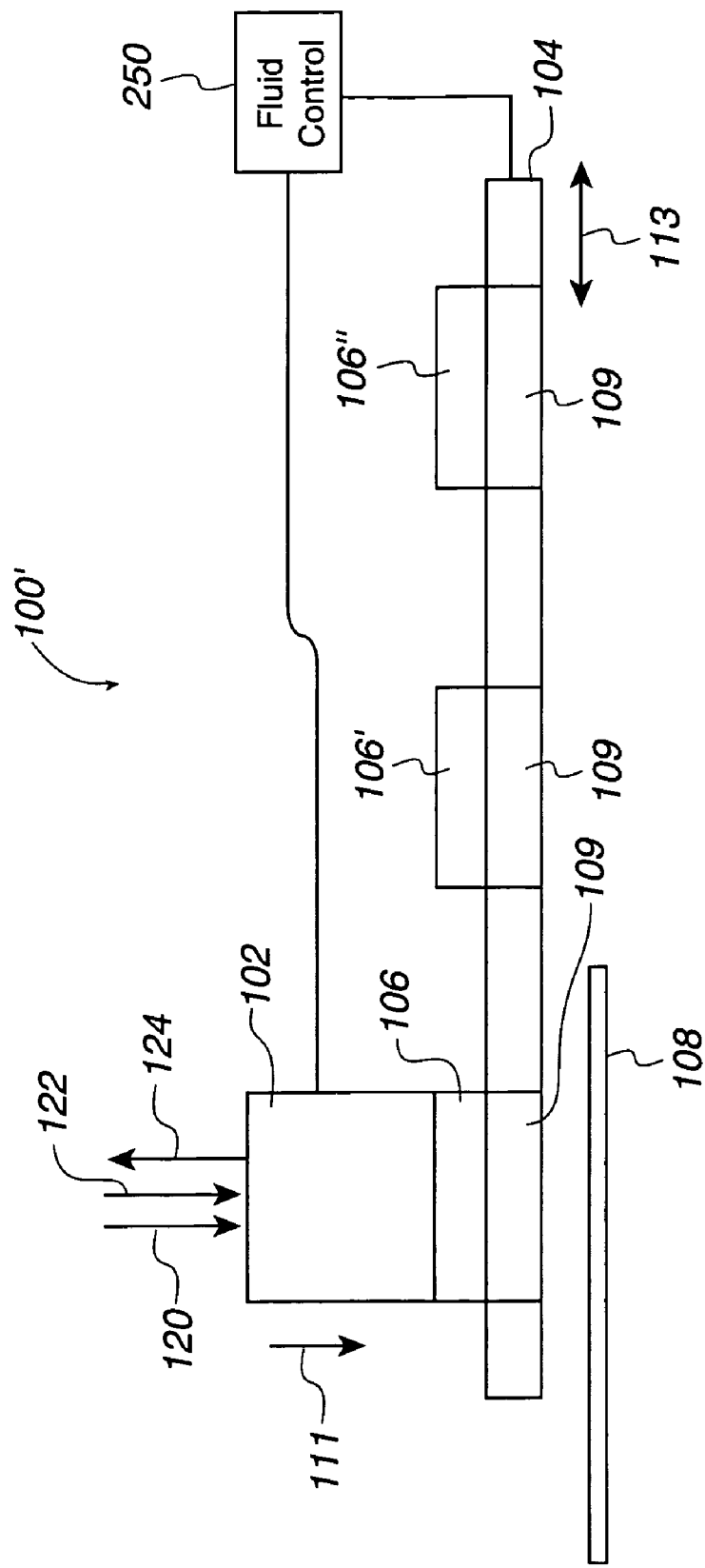
FIG. 6 shows the wafer processing system where the secondary manifold has connected with the primary manifold in accordance with one embodiment of the present invention.

FIG. 6 shows the wafer processing system 100' where the secondary manifold 102 has connected with the primary manifold 106 in accordance with one embodiment of the present invention. In one embodiment, as described in further detail in reference to FIG. 9 below, the primary manifold 106 may have ports which may receive the fluids from the secondary manifold 102. Once the connection between the secondary manifold 102 and the primary manifold 106 has been made, the secondary manifold 102 may move the primary manifold 106 closer to the wafer 108.

Figure 7:
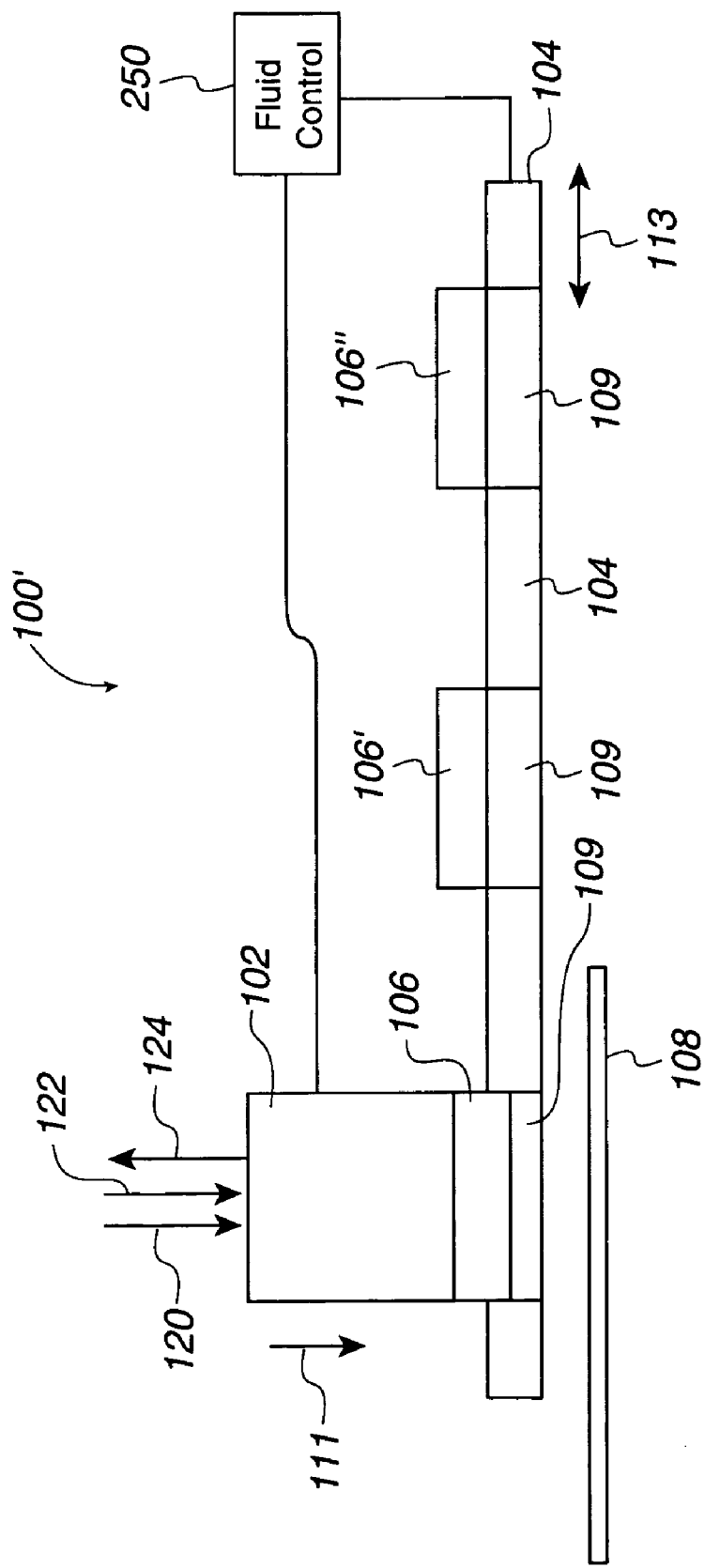
FIG. 7 illustrates the wafer processing system where the secondary manifold has further moved the primary manifold closer to the wafer in accordance with one embodiment of the present invention.

FIG. 7 illustrates the wafer processing system 100' where the secondary manifold 106 has further moved the primary manifold 106 closer to the wafer 108 in accordance with one embodiment of the present invention. In one embodiment, the secondary manifold 102 has moved the primary manifold 106 further into the opening 109. It should be appreciated that the opening 109 may be any suitable size and/or shape as long as the primary manifold 106 may be moved through it.

Figure 8A:
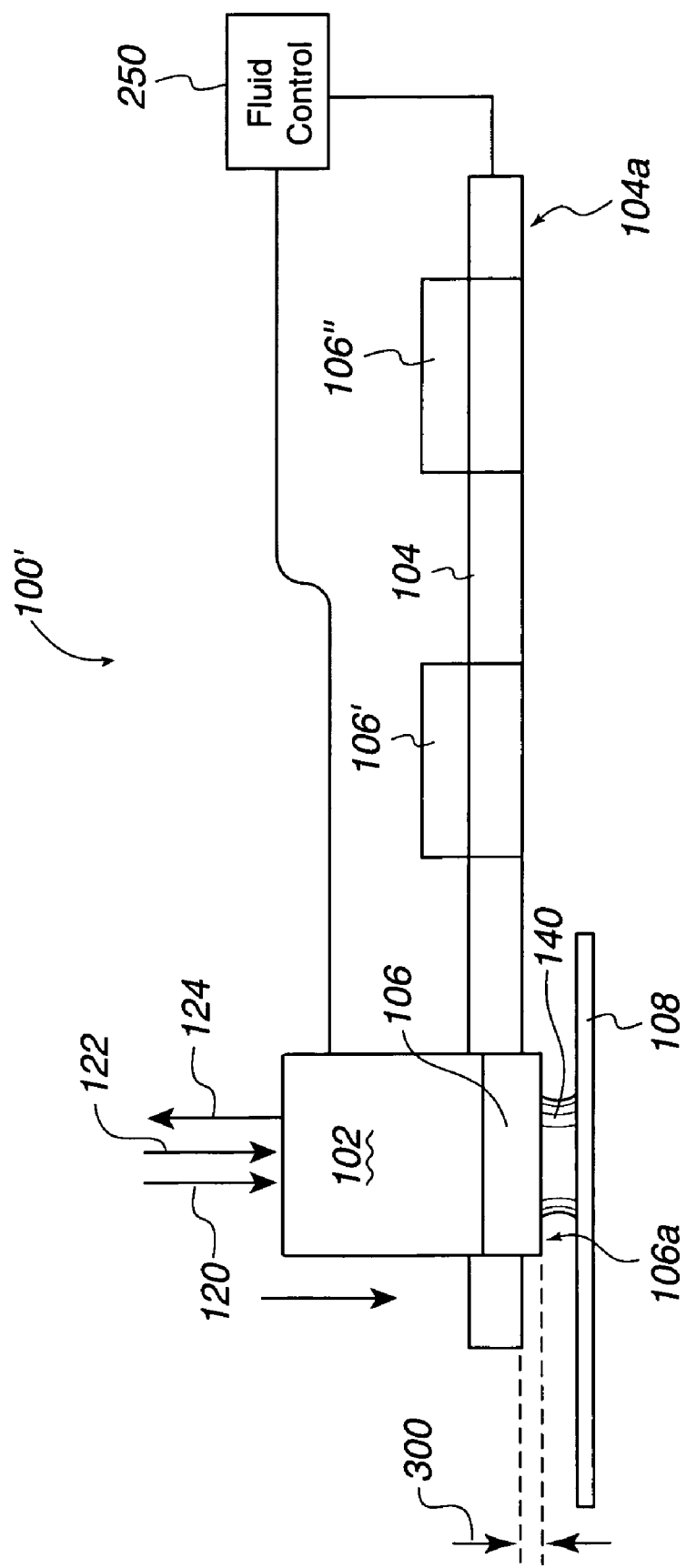
FIG. 8A depicts the wafer processing system where the secondary manifold has moved the primary manifold into close proximity of the wafer in accordance with one embodiment of the present invention.

FIG. 8A depicts the wafer processing system 100' where the secondary manifold 102 has moved the primary manifold 106 into close proximity of the wafer 108 in accordance with one embodiment of the present invention. In one embodiment, the secondary manifold 102 may start inputting the first fluid and the second fluid into the primary manifold 106 through inputs 120 and 122 respectively. The first fluid and the second fluid may then travel into the primary manifold 106 where the first fluid is applied to the wafer 108 through a first inlet on the processing surface 106a and the second fluid is applied to the wafer 108 through a second inlet on the processing surface 106a (as described in further detail in the U.S. Patent Applications referenced above). An outlet may remove the first and second fluid by application of a vacuum (as also described in further detail in the aforementioned U.S. Patent Applications). The removed first fluid and the second fluid may then travel through the primary manifold 106 to the secondary manifold 102 where the first and the second fluid may be removed through the output 124. In one embodiment, a vacuum is applied through the output 124 to assist in the removal of the first fluid and the second fluid through an outlet on a processing face 106a.

In one embodiment, the primary manifold 106 has been moved into a position where the processing surface 106a has moved beyond the plane of a bottom surface of the manifold carrier 104a by a distance 300. It should be appreciated that distance 300 may be any suitable length that enables the processing face 106a to no be coplanar with the bottom surface 104a. In one embodiment, the distance 300 may be between 0.1 mm and 10.0 mm. In another embodiment, the distance 300 may be between 0.5 mm and 2.0 mm, and in a preferable embodiment, the distance 300 may be about 1.50 mm. In one embodiment, the position of the processing face 106a that is not coplanar with the bottom surface 104a reduces the possibility that a meniscus 140 may move or attach itself to the bottom surface 104a through surface tension.

Figure 8B:
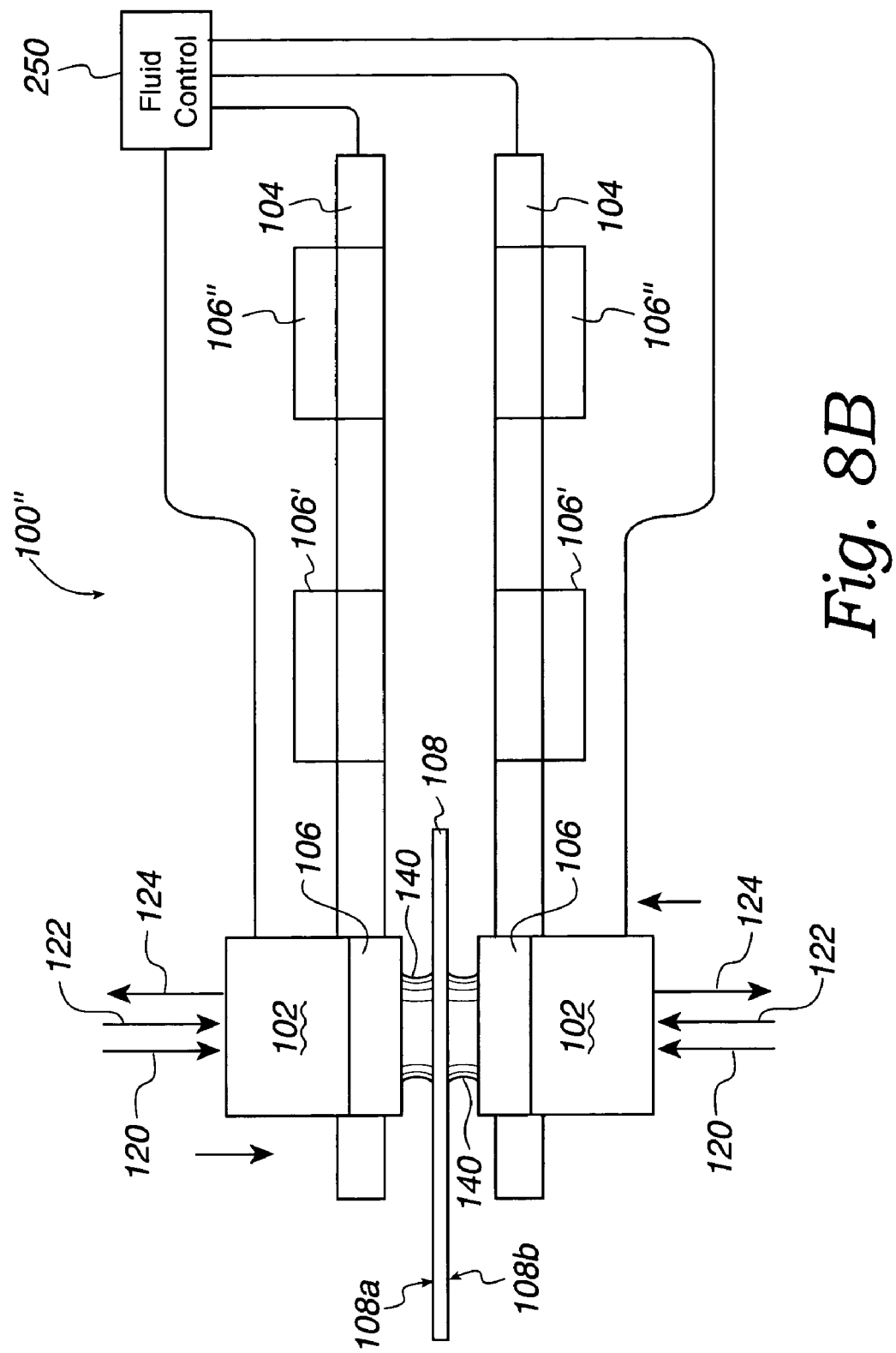
FIG. 8B illustrates a wafer processing system where dual sides of the wafer may be processed in accordance with one embodiment of the present invention.

FIG. 8B illustrates a wafer processing system 100" where dual sides of the wafer 108 may be processed in accordance with one embodiment of the present invention. In one embodiment, the wafer processing system 100' exists above the wafer 108 to process a surface 108a of the wafer 108, and another wafer processing system that is substantially the same (but upside down) as the wafer processing system 100' exists below the wafer 108 to process side 108b of the wafer 108. In such an embodiment, the fluid control 250 may manage the processing of sides 108a and 108b of the wafer 108.

Figure 9:
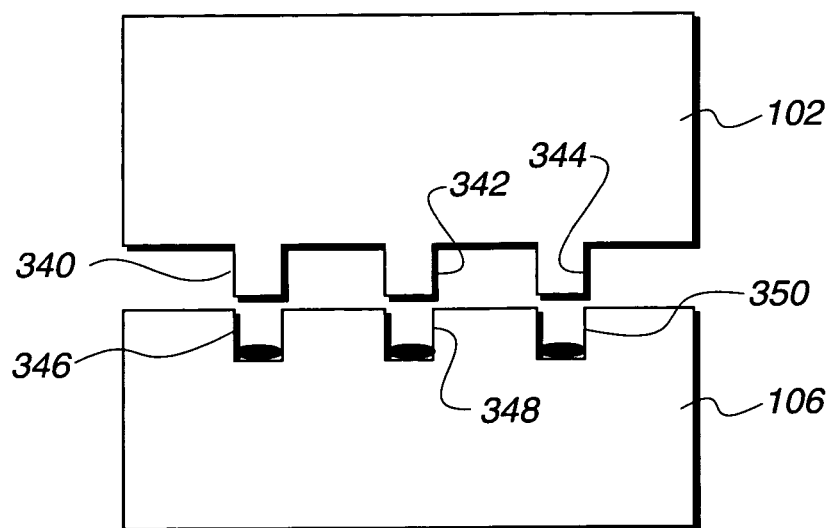
FIG. 9 shows a primary manifold and a secondary manifold in accordance with one embodiment of the present invention.

FIG. 9 shows a primary manifold 106 and a secondary manifold 102 in accordance with one embodiment of the present invention. In one embodiment, the secondary manifold 102 includes output ports 340, 342, and an input port 344 that may be connectible with input ports 346, 348, and an output port 350 of the primary manifold 106 respectively. Once the output ports 340 and 342 are connected with the input ports 346 and 348 respectively and the input port 344 and the output port 350 are connected, then after the secondary manifold 102 has moved the primary manifold 106 into close proximity to the wafer 108, fluid transport may begin. As discussed above in reference to FIG. 8, the first fluid would flow through the output port 340 to the input port 346, the second fluid would flow through the output port 342 to the input port 348, and the first fluid and the second fluid that have been removed from the wafer 108 are transported through the output port 350 into the input port 344. In this way, the first fluid and the second fluid may be supplied to the primary manifold 106 to generate the meniscus 140 (as discussed in reference to FIGS. 8A and 8B).

Figure 10:
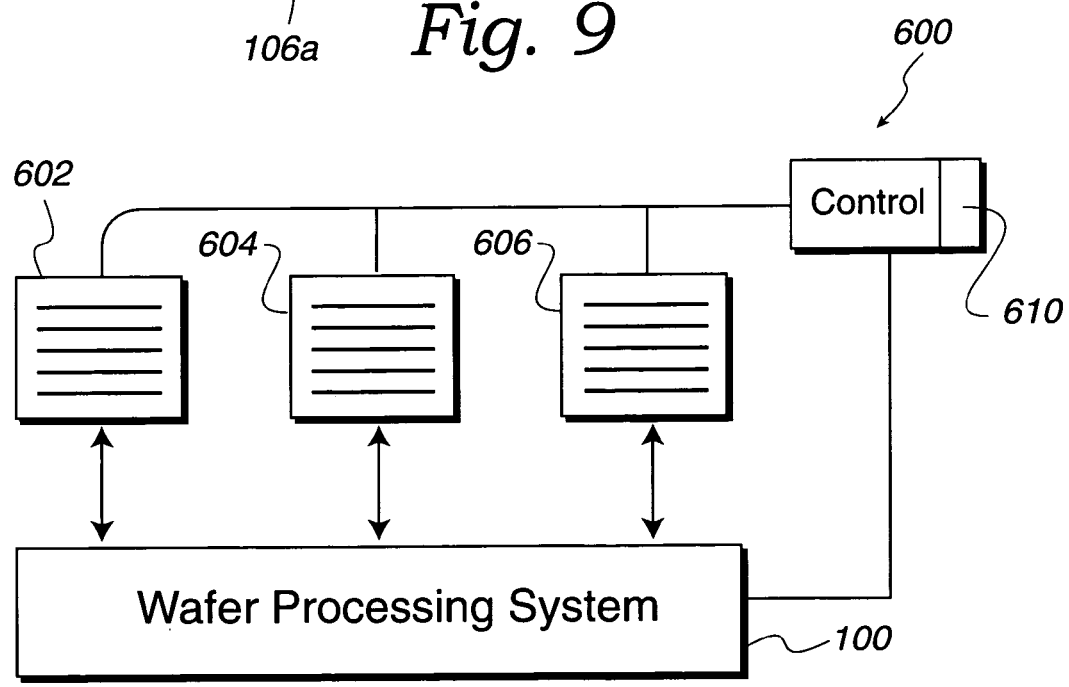
FIG. 10 illustrates a multiple wafer processing system in accordance with one embodiment of the present invention.

FIG. 10 illustrates a multiple wafer processing system 600 in accordance with one embodiment of the present invention. In one embodiment, the multiple wafer processing system 600 includes at least one wafer cassette. In one embodiment, the multiple wafer processing system 600 includes wafer cassettes 602, 604, and 606. It should be appreciated that any suitable number of wafer cassettes may be included in the multiple wafer processing system such as, for example, 1, 2, 3, 4, 5, 6, 7, 8, etc. It should also be understood that each of the wafer cassettes may include any suitable number of wafers to be processed such as, for example, 1, 2, 3, 4, 5, 6, 7, 8, 9, 10, etc.

The multiple wafer processing system 600 may also include a control 610 which may be any suitable hardware and/or software that may manage the input and output of certain wafer cassettes into the wafer processing system 100. In addition, the control 610 may also manage the functionality of the wafer processing system 100 so a certain primary meniscus(es) may be utilized depending on the wafer processing operation desired to be applied to a particular wafer in a particular wafer cassette. Therefore, the control 610 may be configured so each particular wafer cassette undergoes a particular type of wafer processing operation and/or the control 610 may also be configured so each particular wafer of a wafer cassette undergoes a specific type of wafer processing operation regardless of which wafer cassette where the wafer is located. Therefore, a first wafer in a first cassette may undergo, for example, a drying operation while a second wafer in the first cassette may undergo, for example, a cleaning operation. As discussed above, it should be appreciated that any suitable wafer may undergo any suitable type of wafer processing operation regardless of the location in the wafer cassette.

While this invention has been described in terms of several preferred embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. An apparatus for processing a substrate, comprising:
   a first manifold module configured to define and contain a fluid meniscus between a manifold module surface and a substrate surface;
   a second manifold module being configured to connect with the first manifold module and to move the first manifold module into proximity to the substrate surface to generate the fluid meniscus; and
   a manifold carrier for positioning the first manifold module to a region of the substrate to be processed;
   wherein a processing surface of the first manifold module is defined beyond a plane of a bottom surface of the manifold carrier, and a processing surface of the first manifold module comprises a first conduit for applying a first fluid to the substrate surface, a second conduit for applying a second fluid to the substrate surface, and a third conduit for removing the first fluid and the second fluid from the substrate surface, the proximity of the first manifold defined to contain the fluid meniscus between the manifold module surface and the substrate surface.

2. An apparatus for processing a substrate as recited in claim 1, wherein the connection is configured to supply fluids to the first manifold module and to remove fluids from the first manifold module.

3. An apparatus for processing a substrate as recited in claim 2, wherein the second manifold module is configured to supply a first fluid and a second fluid to the first manifold module and to remove the first fluid and the second fluid from the first manifold module.

4. An apparatus for processing a substrate as recited in claim 3, wherein the first manifold module is configured to apply a first fluid and a second fluid to the substrate surface and to remove the first fluid and the second fluid from the substrate surface.

5. An apparatus for processing a substrate as recited in claim 1, wherein the second manifold module is configured to move vertically to connect with the first manifold module.

6. An apparatus for processing a substrate as recited in claim 1, wherein the fluid meniscus conducts one of a plating, etching, drying, and cleaning operation.

7. An apparatus for processing a substrate, comprising:
   a first manifold module having a processing face with a first conduit configured to apply a first fluid to a substrate surface, a second conduit for applying a second fluid to the substrate surface, and a third conduit for removing the first fluid and the second fluid from the substrate surface, the applying and the removing defining a fluid meniscus contained between the processing face and the substrate surface; and a second manifold module being configured to move the processing face of the first manifold module proximate to the substrate surface and to deliver the first fluid and the second fluid to the first manifold module and to remove the first fluid and the second fluid that has been applied to the substrate from the first manifold module;

a manifold carrier for positioning the first manifold module to a region of the substrate to be processed, where a processing surface of the first manifold module is positioned beyond a plane of a bottom surface of the manifold carrier.

8. An apparatus for processing a substrate as recited in claim 7, wherein the second manifold has ports for delivering the first fluid and the second fluid to the first manifold, and the second manifold has at least one port for removing the first fluid and the second fluid that has been applied to the substrate from the first manifold.

9. An apparatus for processing a substrate as recited in claim 7, wherein the first manifold has ports for receiving the first fluid and the second fluid from the second manifold, and the first manifold has at least one port for delivering the first fluid and the second fluid that has been applied to the substrate to the second manifold module.

10. An apparatus for processing a substrate as recited in claim 7, wherein the first fluid is one of an etching fluid, a cleaning fluid, a drying fluid, and a plating fluid, and the second fluid is configured to reduce surface tension of the first fluid.

* * * * *